(12) United States Patent
Sato et al.

(10) Patent No.: US 7,372,047 B2
(45) Date of Patent: May 13, 2008

(54) CHARGED PARTICLE SYSTEM AND A METHOD FOR MEASURING IMAGE MAGNIFICATION

(75) Inventors: Mitsugu Sato, Hitachinaka (JP); Atsushi Takane, Mito (JP); Shigeto Isakozawa, Hitachinaka (JP); Takashi Iizumi, Hitachinaka (JP); Tatsuya Maeda, Hitachinaka (JP); Hiromi Inada, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 329 days.

(21) Appl. No.: 11/038,478

(22) Filed: Jan. 21, 2005

(65) Prior Publication Data

US 2005/0189501 A1 Sep. 1, 2005

(30) Foreign Application Priority Data

Jan. 23, 2004 (JP) ............................. 2004-015049

(51) Int. Cl.
*G21K 5/00* (2006.01)
(52) U.S. Cl. .................... 250/491.1; 250/305; 250/306; 250/307; 250/492.2; 250/492.3
(58) Field of Classification Search ................ 250/305, 250/306, 307, 310, 491.1, 492.2, 492.3
See application file for complete search history.

(56) References Cited

U.S. PATENT DOCUMENTS

| | | | | |
|---|---|---|---|---|
| 4,818,873 A | * | 4/1989 | Herriot | ........................ 250/310 |
| 6,144,877 A | * | 11/2000 | DePetrillo | ................... 600/515 |
| 6,369,891 B1 | * | 4/2002 | Kane et al. | .................. 356/401 |
| 6,753,518 B2 | * | 6/2004 | Watanabe et al. | ......... 250/201.3 |
| 6,835,511 B2 | * | 12/2004 | Hirayanagi | .................. 430/22 |
| 2002/0034338 A1 | | 3/2002 | Askary | |
| 2002/0043611 A1 | * | 4/2002 | Yoshikawa et al. | ...... 250/208.1 |

FOREIGN PATENT DOCUMENTS

JP 2000-323081 11/2000

OTHER PUBLICATIONS

German Office Action issued in corresponding German Application No. 10 2005 002 537.4, dated Dec. 1, 2006.

* cited by examiner

*Primary Examiner*—Jack Berman
*Assistant Examiner*—Michael J Logie
(74) *Attorney, Agent, or Firm*—McDermott Will & Emery LLP

(57) ABSTRACT

A charged particle beam apparatus capable of automatically measuring an image magnification error of an apparatus and capable of automatically calibrating the image magnification in high precision is provided. To this end, while an image processing operation of either an auto-correlation function or an FFT transformation is employed with respect to a scanning image of a reference material having a periodic structure, the averaged pitch dimension of which is known, averaged periodic information owned by the scanning image is detected so as to measure an image magnification error of the apparatus. Also, the information as to the acquired image magnification error is fed back to an image magnification control means of the apparatus so as to automatically execute a calibration as to the image magnification in high precision.

19 Claims, 9 Drawing Sheets

MESH REFERENCE MATERIAL
(NOMINAL PITCH VALUE: 25.4 μM)

MICRO SCALE (NOMINAL PITCH VALUE: 0.240 μM)

MEASUREMENT OF PITCH DIMENSION BY MANUAL CURSOR

AUTOMATIC MEASUREMENT OF PITCH DIMENSION BY LINE PROFILE

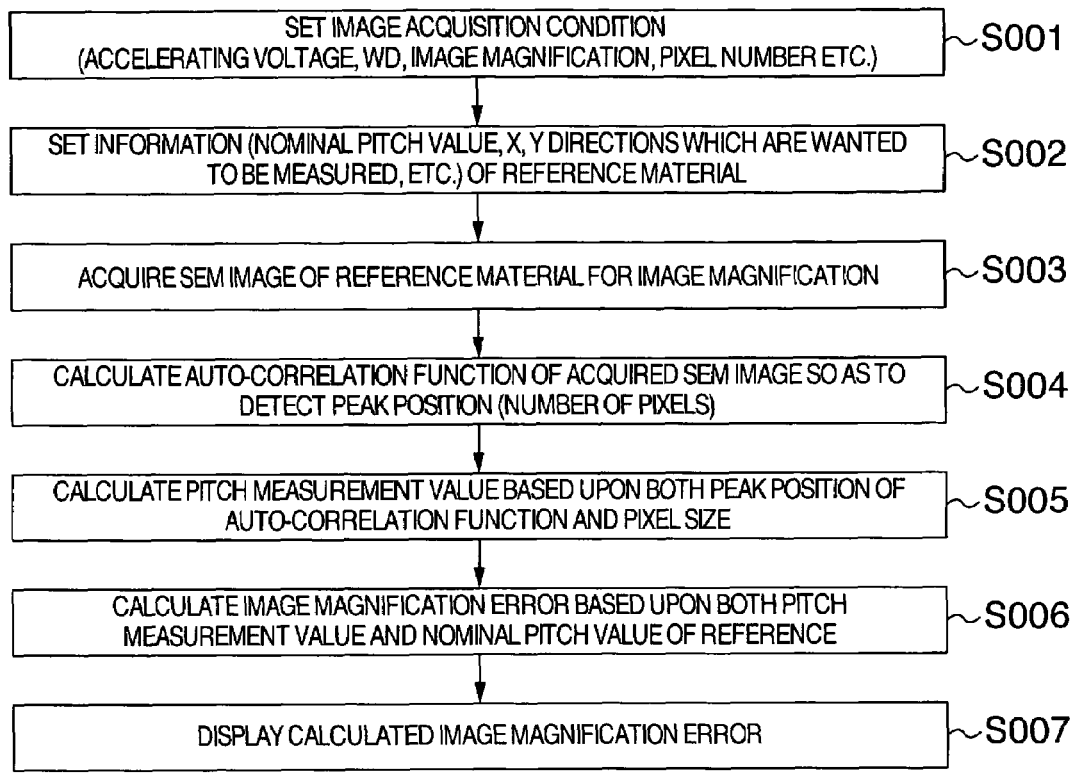
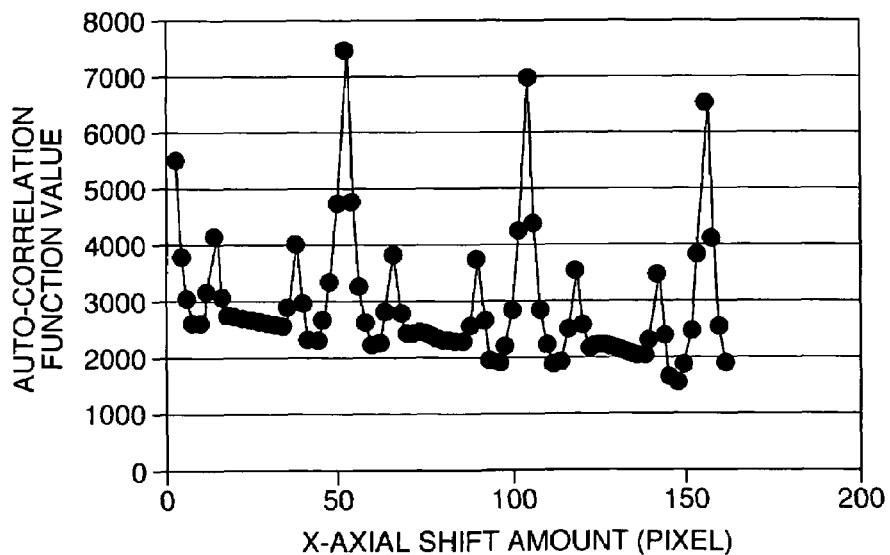

NORMAL SEM IMAGE OF REFERENCE MATERIAL

PROCESSED IMAGE FROM WHICH EDGE INFORMATION HAS BEEN EXTRACTED

CHARGED PARTICLE SYSTEM AND A METHOD FOR MEASURING IMAGE MAGNIFICATION

BACKGROUND OF THE INVENTION

The present application claims priority form Japanese application JP 2004-015049 filed on Jan. 23, 2004, the content of which is hereby incorporated by reference into this application.

The present invention generally relates to a charged particle beam apparatus. More specifically, the present invention is directed to a charged particle beam apparatus capable of measuring actual image magnification of a material image and an image magnification shift of the apparatus in high precision, and also, capable of automatically calibrating image magnification of the apparatus.

In charged particle beam apparatus which are typically known as scanning electron microscopes (SEMs), charged particle beams which have been focused in narrow beams are scanned over materials so as to acquire desirable information (for instance, material images) from the materials. Since such charged particle beam apparatus are employed in order to measure pattern widths and film thicknesses of semiconductor devices, it is very important to maintain image magnification of these apparatus in high precision.

In order to measure an image magnification error, as indicated in FIG. 2A, while employing a reference material for image magnification which has a periodic structure whose pitch dimension (period) is already known as a nominal value, an enlarged image of this reference material is acquired. Then, a pitch dimension of a material is measured based upon the acquired enlarged image. Thereafter, a shift between this measurement value and the nominal pitch value is used as an image magnification error. In order to calibrate image magnification of an apparatus, an image magnification control parameter of this apparatus is adjusted in such a manner that this image magnification error becomes minimum. In a scanning beam microscope, this image magnification control parameter corresponds to a coefficient for determining a relationship between image magnification and a beam scanning width on a material.

In general, a nominal pitch value of a reference material for image magnification represents an averaged pitch value of a repetition pattern of this reference material for image magnification. As a result, in order to perform an image magnification calibration in high precision, pitches are measured at at least 10 different positions on the reference material, and then, a pitch measurement value of an image must be determined from an average value of these measured pitch values.

FIG. 3A and FIG. 3B indicate an example as to conventional pitch measuring methods. As indicated in FIG. 3A, in order to measure a pitch ($L_m$) of a reference material from a material image, a cursor is manually set to a position corresponding to the pitch on the material image which has been acquired as a digital image, and then, a total number of pixels (N) between the cursors is counted. Based upon this counted value ($N_m$) and a pixel size ($L_p$) of the material image, the pitch ($L_m$) is calculated by the following equation (1)

$$L_m = N_m * L_p \tag{1}$$

As other pitch measuring methods, as indicated in FIG. 3B, the following measuring method has been practically used. That is, while a pitch measuring area of a material image is designated, a pattern edge portion is detected from a line profile between these pitch measuring areas, and then, a pitch dimension is automatically measured. This line profile corresponds to a distribution of pixel values (brightness) along either a horizontal line or a vertical line. On the other hand, a relationship between the pixel size ($L_p$) and image magnification (M) is defined as follows:

$$L_p = K_p/(N_p * M) \tag{2}$$

In this equation (2), symbol "$K_p$" indicates a display size of an image in order to correctly display image magnification, and symbol "$N_p$" indicates a total number of pixels. For example, assuming now that a total pixel number of an acquired image is equal to 640×480 pixels and a display size of the image is equal to 128 mm×96 mm, the pixel size "$L_p$" in the image magnification of 10,000 power becomes 128 mm/(640×10,000)=20 nm. As a consequence, when the image magnification "M" contains an error, this error appears as an error of the pixel size "$L_p$" of the equation (2), so that an error may be produced in the pitch dimension ($L_p$) calculated in the equation (1).

Based upon the pitch measurement value ($L_m$) and the nominal pitch value ($L_s$) of the reference material which have been measured by the above-described measuring method, a shift "$\Delta M$" of image magnification of the apparatus may be calculated by the following equation (3):

$$\Delta M = (L_m/L_s) - 1 \tag{3}$$

In a scanning beam microscope (SEM), the below-mentioned relationship (4) between image magnification (M) and a beam scanning width ($L_b$) on a material is established as follows:

$$M = K_m/L_b \tag{4}$$

An image magnification coefficient "$K_m$" is employed so as to control image magnification (namely, to control beam scanning width) within a control program of an SEM apparatus. In such a case that the image magnification shift "$\Delta M$" of the above-described equation (3) is present with respect to such an image magnification coefficient "$K_m$" before being calibrated, if the below-mentioned equation (5) is established, then the image magnification of the SEM apparatus may be calibrated:

$$M = K_m * (L_m/L_s)/L_b \tag{5}$$

In other words, such a process operation for converting the value of the image magnification coefficient used to control the SEM apparatus to "$K_m*(L_m/L_s)$" corresponds to an image magnification calibration.

In a general-purpose scanning electron microscope (SEM) in which operating ranges as to accelerating voltages and WD are wide, it is technically difficult to control the image magnification in high precision over the entire operating area. As a consequence, the image magnification precision of this general-purpose SEM apparatus is set to ±10%. As a result, in order to perform observations and dimension measuring operations in higher precision while using such a general-purpose SEM apparatus, image magnification calibrations must be carried out with respect to each of apparatus use conditions such as accelerating voltages and WD.

Also, for example, JP-A-2000-323081 discloses such a technical idea of a transmission type electron microscope (TEM). That is, two sheets of different images are compared with each other so as to measure an image magnification error of the TEM apparatus.

SUMMARY OF THE INVENTION

Since higher precision (approximately ±1%) is necessarily required for measuring dimensions in semiconductor devices, in such a case that such a high precision dimension measuring operation is carried out in a general-purpose SEM, an image magnification calibration must be carried out with respect to each of use conditions such as accelerating voltages and WD. However, in the above-described conventional techniques, the pitches must be measured at the plural positions on the reference material so as to calibrate the image magnification. Furthermore, since these measuring works are manually performed, and occurrences of human errors and measuring mistakes cannot be avoided, the following problem may occur. That is, image magnification shifts cannot be simply measured in higher precision in user levels, and further, high-precision image magnification calibrations cannot be simply carried out by users.

Also, in accordance with the conventional technical idea described in JP-A-2000-323081, images which constitute a reference image must be previously acquired by employing the same material, and also, under the same optical conditions. There is another problem that cumbersome operations are necessarily required, and further, high-precision measuring operations can be hardly carried out due to adverse influences caused by aging effects as to apparatus conditions.

The present invention has been made to solve the above-described problems of the conventional techniques, and therefore has an object to provide both a method and an apparatus, which are capable of measuring an image magnification shift from an acquired image of a reference material for image magnification in higher precision, and also, capable of realizing a correction of the image magnification shift in higher precision.

To achieve the above-described object, in accordance with the present invention, both a method and an apparatus are provided, by which a pitch of a periodic structure on a material is measured based upon periodic information as to a predetermined position of an image which is acquired by scanning a charged particle beam on the material, and, an image magnification error of the charged particle beam is measured based upon the measured pitch.

It should be noted that concrete contents of the present invention, or other structures of the present invention and effects thereof will be explained in the below-mentioned embodiment modes of the present invention.

In accordance with the present invention, the image magnification shift is detected from the acquired SEM image of the reference material for image magnification, and thus, the high-precision image magnification calibration can be automatically carried out. Also, the optimum image condition for the image magnification measuring operation can be automatically set in response to the nominal pitch value of the reference material, so that the image can be acquired. Since the auto-correlation function and the FFT method are employed in the image magnification measuring operation, the measured pitch information may become the averaged pitch value in the entire image, and thus, the result having the high reliability can be obtained which is mostly suitable for the nominal pitch value of the reference material.

Other objects, features and advantages of the invention will become apparent from the following description of the embodiments of the invention taken in conjunction with the accompanying drawings.

BRIEF DESCRIPTION OF THE DRAWINGS

FIG. 4 is a flow chart for describing process operations of a method for measuring an image magnification error by utilizing an auto-correlation function.

FIG. 5 is a graphic represention for indicating an example as to an auto-correlation function processing result obtained from the SEM image of the reference material for image magnification.

DETAILED DESCRIPTION OF THE EMBODIMENTS

Figure 1:
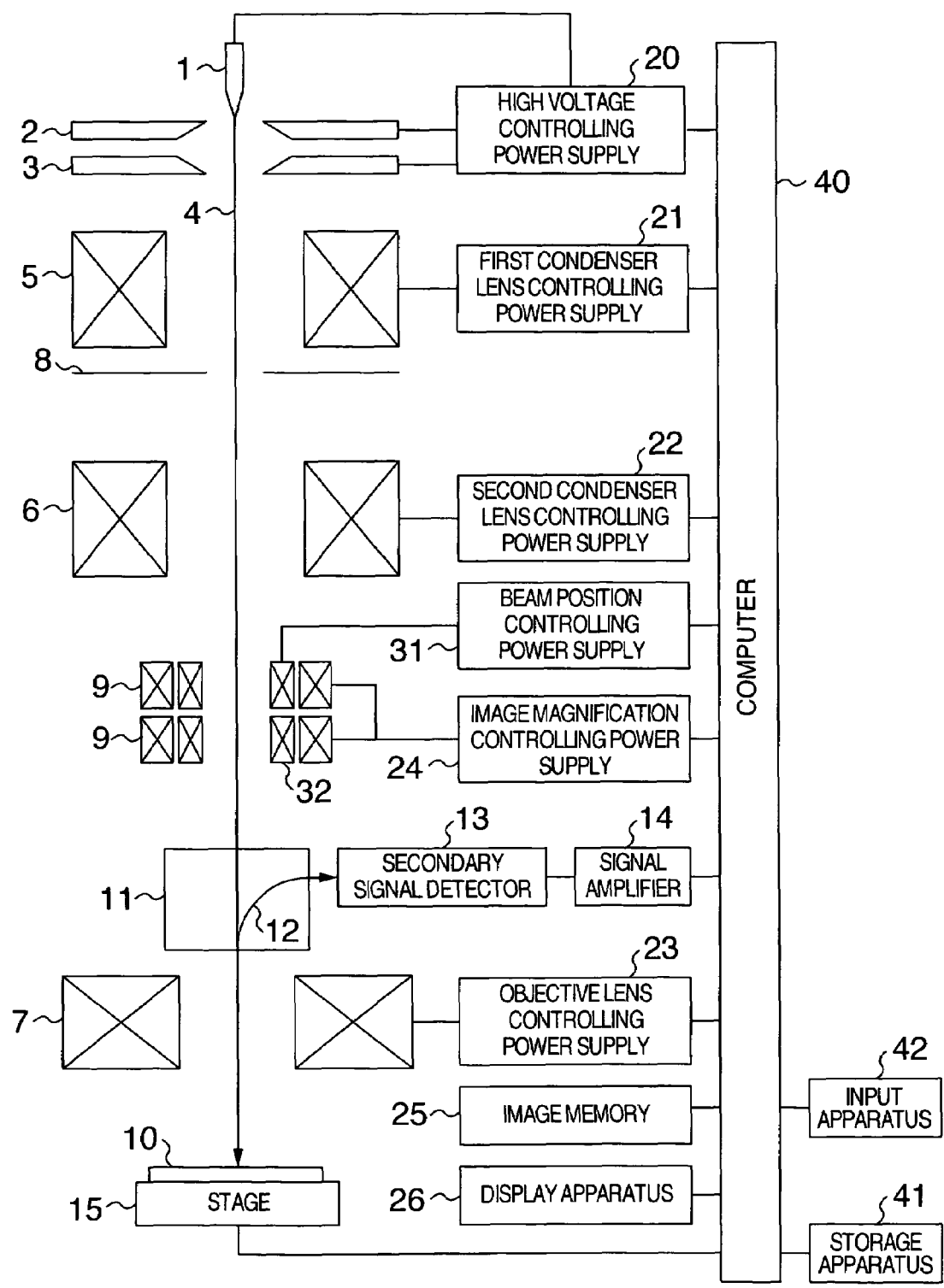
FIG. 1 is a schematic structural diagram of a scanning electron microscope according to one example of the present invention.

Now, in embodiments of the present invention, a description is made of technical ideas for measuring image magnification errors in such a manner that auto-correlation functions are acquired from digital images of reference materials for image magnification, which own periodic structures, so as to measure peaks of correlation values, and also, technical ideas for detecting spatial frequencies corresponding to periods by FFT-transforming images.

Also, a description is made of such a technical idea that when a period (pitch) on an image is larger than a predetermined value, periodic information is detected by an auto-correlation method, whereas when a period (pitch) on an image is smaller than the predetermined value, periodic information is detected by an FFT transformation method. A further description is made of such a technical idea that when a periodic number (namely, total number of patterns) on an image is smaller than a preselected number, a plurality of material images within different visual fields of the material are acquired; an averaged value is calculated from respective periodic information detected from the plurality of acquired material images; and then, this calculated averaged value is employed as a representative value of the period.

In addition, a description is made of both a technical idea capable of calculating an image magnification shift of an apparatus to display the image magnification shift, and a technical idea capable of calibrating the image magnification shift. That is, a nominal periodic value (known periodic value) of a reference material is entered to an apparatus; information as to image magnification and a pixel size of the apparatus is extracted from a control unit of the apparatus; and the image magnification shift of the apparatus is calculated based upon the information as to either the extracted image magnification or the extracted pixel size, the detected periodic information, and the nominal periodic value of the material; and then, the calculated image magnification shift is displayed and calibrated.

Also, a description is made of such a technical idea that in order to detect as to whether or not an image is proper which has been acquired so as to measure, or calibrate image magnification, a direction (rotation) of a pattern is detected from the acquired image; and in such a case that the detected direction of the pattern cannot satisfy a predetermined condition, warning is issued. Further, a description is made of such a technical idea capable of controlling an apparatus in order that the direction of the rotated pattern is corrected so as to reacquire an image, namely, a control of a beam scanning direction, or a control of a rotation direction of a stage is carried out.

In addition, a description is made of such a technical idea that both a total number of pixels and image magnification, which are proper for measuring, or calibrating image magnification, from both an image magnification range which constitutes a nominal pitch value and a measurement object of a reference material, and from a pixel number selecting range of an acquired image.

Referring now to drawings, an embodiment mode of the present invention will be described.

FIG. 1 is a diagram for schematically showing a structure of a scanning electron microscope according to one example of the present invention. In the scanning electron microscope, a voltage is applied between a cathode 1 and a first anode 2 by a high voltage controlling power supply 20 which is controlled by a computer 40, and primary electron beams 4 are derived from the cathode 1 by a predetermined emission current. An accelerating voltage is applied between the cathode 1 and a second anode 3 by the high voltage controlling power supply 20 under control of the computer 40, and the primary electron beams 4 emitted from the cathode 1 are accelerated, and the accelerated primary electron beams 4 are traveled to a lens system provided at a post stage. The primary electron beams 4 are focused by a first condenser lens 5 which is controlled by a first condenser lens controlling power supply 21, an unnecessary area of the primary electron beams 4 is removed by an aperture plate 8, and thereafter, the resulting primary electron beams 4 are focused as a very fine spot onto a material 10 by both a second condenser lens 6 controlled by a second condenser lens controlling power supply 22, and an objective lens 7 controlled by an objective lens controlling power supply 23. As the objective lens 7, various lens modes may be employed, for instance, an in-lens type, as out-lens type, a snorkel type and the like. Also, a retarding type objective lens may be employed, while a negative voltage is applied to a material so as to decelerate primary electron beams. Furthermore, the respective lenses may be arranged as an electrostatic type lens constituted by a plurality of electrodes.

The primary electron beams 4 are scanned on the material 10 in a two-dimensional manner by a scanning coil 9 controlled by an image magnification controlling power supply 24. A secondary signal 12 such as secondary electrons which are produced by irradiating the primary electron beams on the material 10 is propagated to an upper portion of the objective lens 7, and thereafter, is separated from the primary electrons by a crossed electrostatic and magnetic field producing E cross B device 11 for separating a secondary signal, and then, the separated secondary signal is detected by a secondary signal detector 13. After the signal detected by the secondary signal detector 13 is amplified by a signal amplifier 14, the amplified signal is transferred to an image memory 25 so as to be displayed as a material image on an image display apparatus 26.

While two stages of deflection coils (image shift coils) 51 controlled by a beam position controlling power supply 31 are arranged at the same position as the scanning coil 9, a scanning area (observation visual field) of the primary electron beams 4 can be moved in a two-dimensional manner.

A stage 15 can move the material 10 along at least two directions (namely, X direction and Y direction) within a plane perpendicular to the primary electron beams.

An input apparatus 42 may designate image acquiring conditions (scanning speed, accelerating voltage, magnification, pixel number etc.), and also, can designate outputs and storages of images. Then, the acquired image data, the designated observation condition, and the like are stored in a storage apparatus 41.

Embodiment 1

Referring now to FIG. 4 and FIG. 5, a detailed description is made of such an embodiment 1 that an image magnification shift is measured by utilizing an auto-correlation function by operating the scanning electron microscope shown in FIG. 1.

FIG. 4 is a flow chart for indicating process operations in which an image magnification error is measured by using the auto-correlation function.

Step 1:

Both a condition (accelerating voltage, WD, image magnification etc.) used to measures the image magnification error, and a total number of pixels (image resolution) used to acquire an image are set.

Step 2:

Information (nominal pitch value and direction for measuring image magnification error) as to a reference material for image magnification is set which is used so as to measure an image magnification error. For instance, in the case of a mesh reference material shown in FIG. 2A, since periodic structures are present along both an X direction and a Y direction, image magnification errors can be measured along both the X direction and the Y direction. However, in the case of such a reference material as a micro scale indicated in FIG. 2B, a measurement as to an image magnification error along such a direction perpendicular to a pattern direction is restricted. In such a case that either one piece or plural pieces of reference materials have been previously determined, material information may be alternatively set by displaying a list of the plural reference materials on an input screen so as to select a desirable reference material from this list.

Step 3:

An SEM (Scanning Electron Microscope) image of the reference material for image magnification is acquired.

Figure 2A:
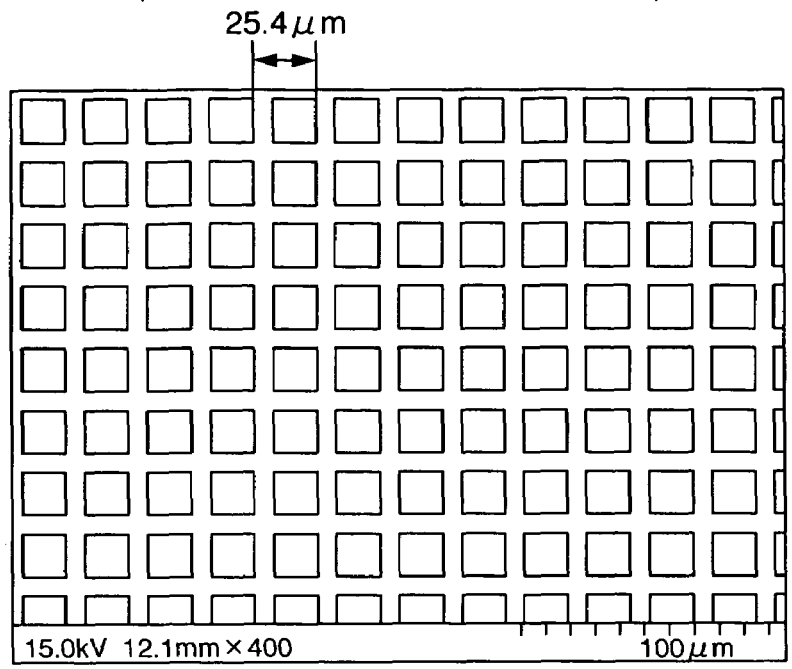
FIG. 2A and FIG. 2B are diagrams for illustratively showing SEM images of a reference material for image magnification.

Step 4:

An auto-correlation function of the acquired SEM image is calculated so as to detect a position (number of pixels) where a correlation value becomes a peak. FIG. 5 graphically represents an example of an auto-correlation function along the X direction with respect to the mesh reference material image shown in FIG. 2A. In this example, when the mesh image of FIG. 2A is shifted by 52 pixels along the X direction, a peak of a correlation value is detected. If a plurality of correlation values located before/after the peak of the correlation value are processed by way of a non-linear interpolation such as a secondary function, then the peak position can be detected in such a high precision smaller than, or equal to 1 pixel. It should be understood that although the auto-correlation function may be carried out over the entire image which has been acquired, the auto-correlation function may be performed by employing a portion (for instance, image center portion) of the image. Also, in the case that image magnification is low, and/or a scanning speed of beams is fast, there are some possibilities that image magnification of an image peripheral portion is slightly different from image magnification of an image center portion due to distortions of beam scanning operations. In such a case, it is proper to measure an image magnification error by employing data as to the image center portion. In the above-described case, the following measuring sequence may be alternatively established. That is, when image magnification is low, an image range for measuring an image magnification error is selected while the image peripheral portion is excluded, whereas when image magnification is high, either the entire image range or such a range larger than the image range for the low image magnification is selected to be an image range (predetermined area) used to measure an image magnification error. As a result, the image magnification errors can be measured in high precision irrespective of the image magnification.

Step 5:

In this embodiment 1, a total number of pixels when an image is acquired is equal to 640×480 pixels, and a pixel size in image magnification of 400 power (example of mesh image shown in FIG. 2A) becomes 0.5 μm based upon a relationship between the pixel size and control image magnification of the apparatus. As a result, pitch information which is measured by the auto-correlation function may be calculated as follows:

52pixels×0.5 μm=26.0 μm.

Step 6:

An image magnification error is calculated based upon both the measured pitch value and the nominal pitch value of the step 5. In this embodiment 1 (mesh material of FIG. 2A), since the nominal pitch value is 25.4 μm, the image magnification error may be calculated as follows:

(26.0−25.4)/25.4=0.024(2.4%)

Step 7:

The image magnification error calculated in the step 5 is displayed on the display apparatus. In such a case that the image magnification error is larger than a predetermined allowable value, such a warning message "image magnification error exceeds allowable value" may be alternatively displayed on this display apparatus.

In accordance with the method of this embodiment 1 for acquiring the correlative relationship among the images within a predetermined area, while the pitch measuring operations at the plural positions are no longer required which have been executed in the conventional method, the image magnification error can be measured in the high precision without human errors as well as measuring mistakes, and furthermore, the image magnification error can be calibrated based upon the high-precision image magnification error measurement result. It should also be understood that the above-described effect achieved by this embodiment 1 does not exclude such a technical idea that a plurality of image magnification errors are measured by acquiring an auto-correlation function with respect to each of plural areas on an image from the technical scope of the present invention. For instance, in the case that a plurality of reference materials are present on a single screen, a predetermined area is set to each of these reference materials, an auto-correlation function as to each of these areas is calculated, so that a plurality of image magnification errors may be alternatively calculated.

Embodiment 2

Figure 6:
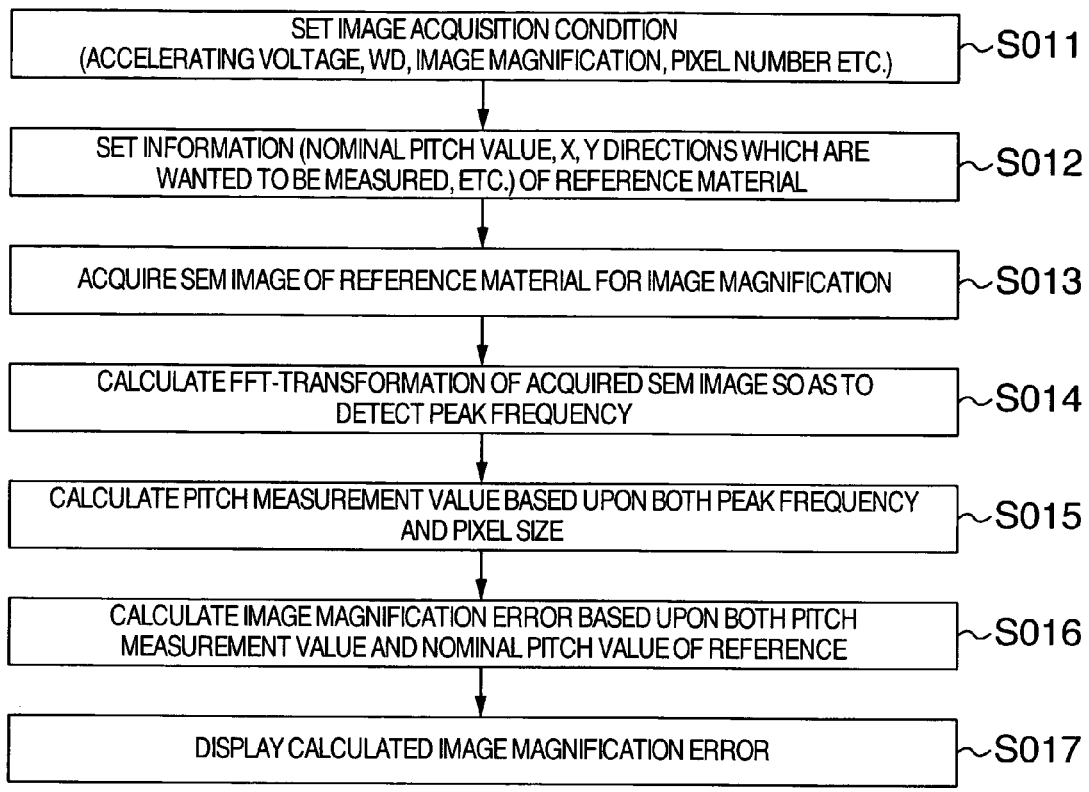
FIG. 6 is a flow chart for describing process operations of a method for measuring an image magnification error by utilizing an FFT transformation.
Figure 8:
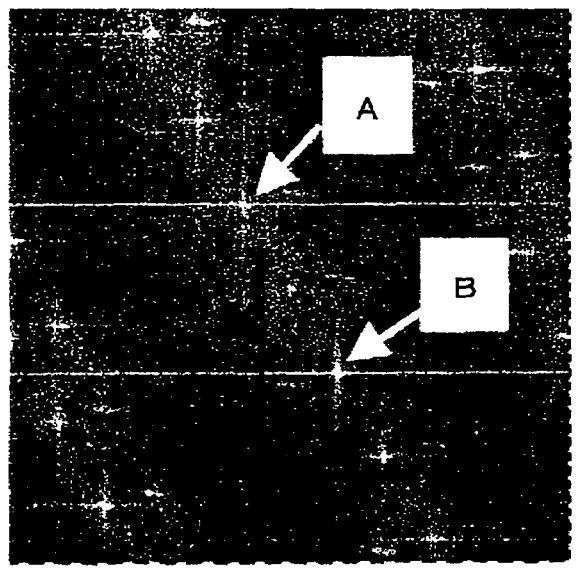
FIG. 8 is a diagram for showing an example of a result obtained by FFT-transforming the SEM image of the reference material for image magnification.

Referring now to FIG. 6 and FIG. 8, a detailed description is made of such an embodiment that an image magnification error is measured by utilizing an FFT transformation by operating the scanning electron microscope shown in FIG. 1.

FIG. 6 is a flow chart for indicating process operations in which an image magnification error is measured by using the FFT transformation (Fast Fourier Transformation).

Step 11 to Step 13:

An SEM image as to a reference material for image magnification is acquired as a digital image in a similar sequential operation to that of the above-described embodiment 1.

Figure 2B:
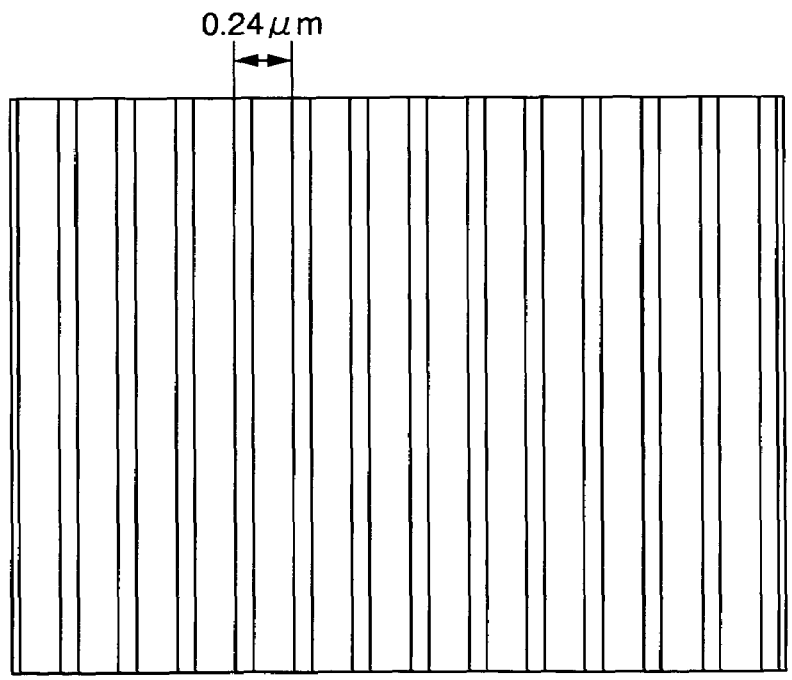
Figure 3A:
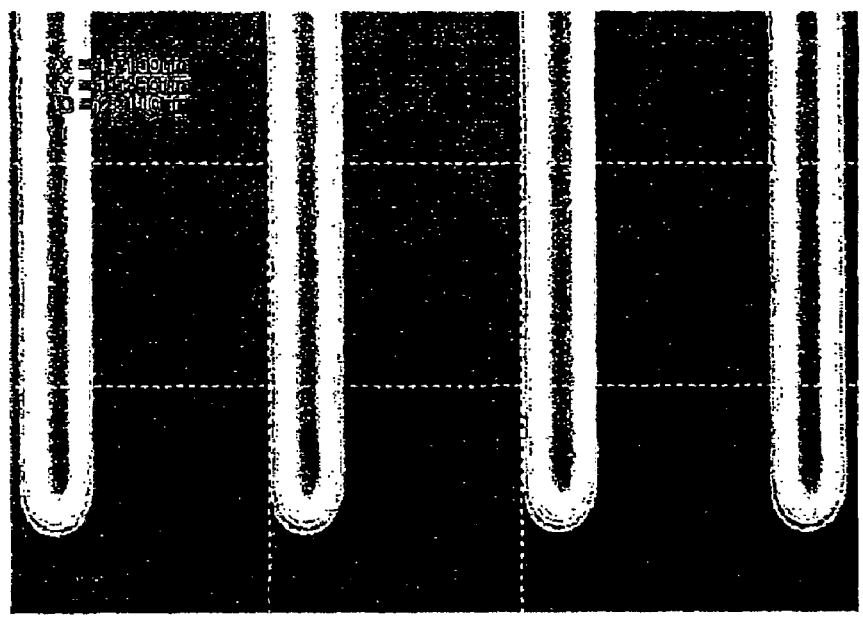
FIG. 3A and FIG. 3B are diagrams for indicating the conventional measuring method of the pitch dimensions.
Figure 3B:
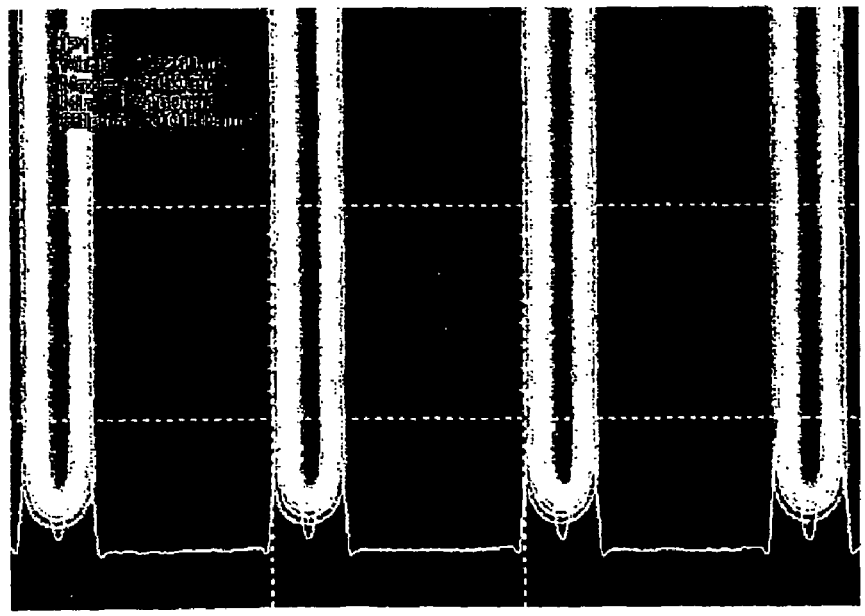
Figure 7:
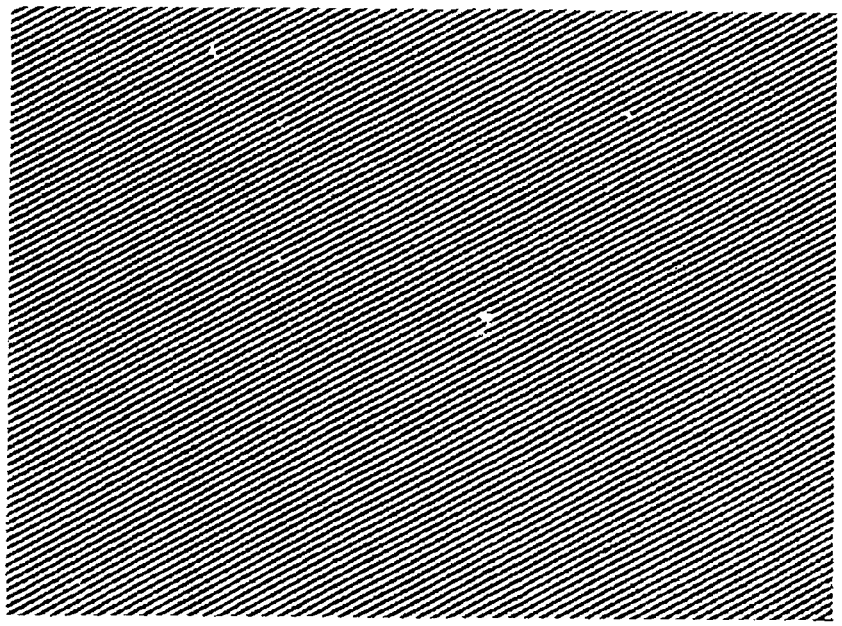
FIG. 7 is a diagram for showing an SEM image of a reference material for image magnification which is used in the example of the FFT transformation.

Step 14:

The FFT transformation of the acquired SEM image is calculated, FIG. 7 shows an SEM image (total pixel number: 640×480 pixels) as to the reference material for image magnification employed in this embodiment 2. The embodiment 2 indicates such an example that while the micro scale material shown in FIG. 2B is employed, an image magnification error in relatively low image magnification (5000 power) is measured. While the FFT transformation can be carried out over the entire image, such an FFT transformation may be alternatively carried out by extracting only such an image portion from the image center portion by plural pixels whose number is power of 2. In the case of the FFT transformation, if a total number of pixels is selected to be power of 2, then calculation time may be shortened. FIG. 8 represents an FFT transformation result obtained by that 256×256 pixels of a center portion of the SEM image shown in FIG. 7 are extracted therefrom, and then, the FFT transformation is calculated. From this FFT transformation result of FIG. 8, peak frequencies (namely, both point "A" (frequency coordinate: −21, −39) and point "B" (frequency coordinate: 21, 39)) can be calculated. An absolute value of a spatial frequency is equal to 44.3 as to both the point A and the point B.

Step 15:

A pitch measurement value is calculated based upon both the peak frequencies and the pixel size.

From the pitch frequency (namely, 44.3) obtained in the step 14, a pitch dimension (total number of pixels) may be calculated as 256/44.3=5.78 pixels. Also, a pixel size of an SEM image having the image magnification of 5000, which has been acquired based upon 640×480 pixels becomes equal to 0.04 μm. As a result, a pitch measurement value of this case may be calculated as 5.78×0.04 μm=0.231 μm.

Step 16:

An image magnification error is calculated based upon both the pitch measurement value and the nominal pitch value of the material.

In this embodiment 2, since the nominal pitch value of the reference material (FIG. 7) is equal to 0.240 μm, the image magnification error may be calculated as follows:

(0.231−0.240)/0.240=−0.038(−3.8%)

Step 17:

Similar to the embodiment 1, the calculated image magnification error is displayed.

Embodiment 3

In an embodiment 3, the below-mentioned method will now be explained. That is, a one-dimensional averaged line profile is produced from a digital image as to a reference material for image magnification, and then, a pitch dimension is detected from this produced line profile by way of an auto-correlation function.

In the case that such a reference material as the micro scale of FIG. 2B having a pattern structure made only in one direction is employed, line profiles along a direction perpendicular to the pattern are averaged along the direction of this pattern, so that one piece of line profile (namely, averaged line profile) can be produced. If this averaged line profile is shifted along a direction perpendicular to the pattern and an auto-correlation function is calculated, then such a position that a peak of a correlative value appears corresponds to a pitch dimension of the pattern. In this method, even when S/N (signal-to-noise ratio) of an image is deteriorated, a pitch dimension can be measured under high reproducibility, and also, calculation time can be largely shortened, as compared with that for an auto-correlation function of a two-dimensional image.

Embodiment 4

In an embodiment 4, the following method will now be described with reference to FIG. 9. That is, periodic detecting methods are switched in the case that a period (converted into pixel number) of a reference material for image magnification is smaller than a predetermined value, and larger than this predetermined value with respect to a pixel size (converted into pixel number).

Figure 9:
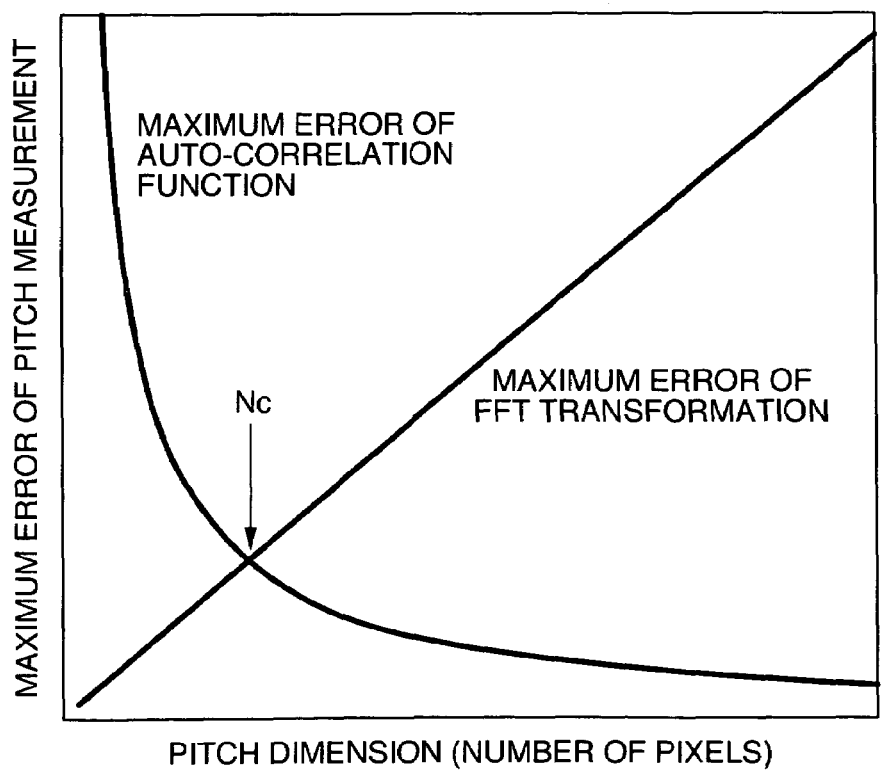
FIG. 9 is a graphic representation for representing a relationship between pitch measuring errors and pitch pixel numbers, which are processed by the auto-correlation function and the FFT transformation.

FIG. 9 indicates a relationship between a total number of pixels which forms a period (pitch) constituting a measurement subject on an image, and maximum errors occurred when the period is detected by way of the auto-correlation function and the FFT transformation. As indicated in FIG. 9, in the case of the auto-correlation function, the larger a total number of pixels (pitch pixel number) corresponding to the pitch dimension is increased, the higher the measuring precision is improved. On the other hand, in the case of the FFT transformation, if a total number of pitch pixels is increased, then a total number of periods in the entire image is decreased, so that measuring precision is conversely lowered. Assuming now that a pitch pixel number under which the maximum measurement errors of both the auto-correlation function and the FFT transformation are made coincident with each other is equal to "$N_c$", when a pitch dimension is larger than this pitch pixel number "$N_c$", the auto-correlation function is employed, whereas when a pitch dimension is smaller than this pitch pixel number "$N_c$", the FFT transformation is employed, so that pitch measuring errors can be suppressed to a minimum error. Maximum errors (namely, peak position detecting errors) occurred when peak positions are detected based upon the auto-correlation and the FFT transformation are different from each other, depending upon peak detecting methods. Assuming now that the peak detecting precision of both cases is made coincident with each other in the pixel conversions (for example, precision of ±0.5 pixels), the following fact could be found out: That is, the pitch pixel number "$N_c$" under which the maximum values of the measuring errors of both cases are made coincident with each other is given as follows:

$$N_c = \sqrt{N_p} \qquad (6).$$

In this equation (6), symbol "$N_p$" denotes a total number of pixels of a measured image.

A pitch pixel number on an acquired image may be predicted from a nominal pitch value of a reference material, image magnification of an apparatus, and also, a total pixel number of a measured image. As a consequence, since this predicted value is compared with the pitch pixel number "$N_c$" of the equation (6), a proper (namely, smaller measuring error) measuring method can be selected from the auto-correlation function and the FFT transformation. Alternatively, a pitch pixel number may be firstly measured by way of the auto-correlation function, and then, a final detecting method may be selected by comparing this measured pitch pixel number with the above-described pitch pixel number "$N_c$."

Embodiment 5

In an embodiment 5, an image magnification error measuring method will now be explained with reference to FIG. 10. That is, especially, such a measuring operation of the image magnification error in high image magnification is carried out in the case that a periodic number (pattern number) required for sufficiently securing reliability of this measuring operation is not present on an acquired image.

Figure 10:
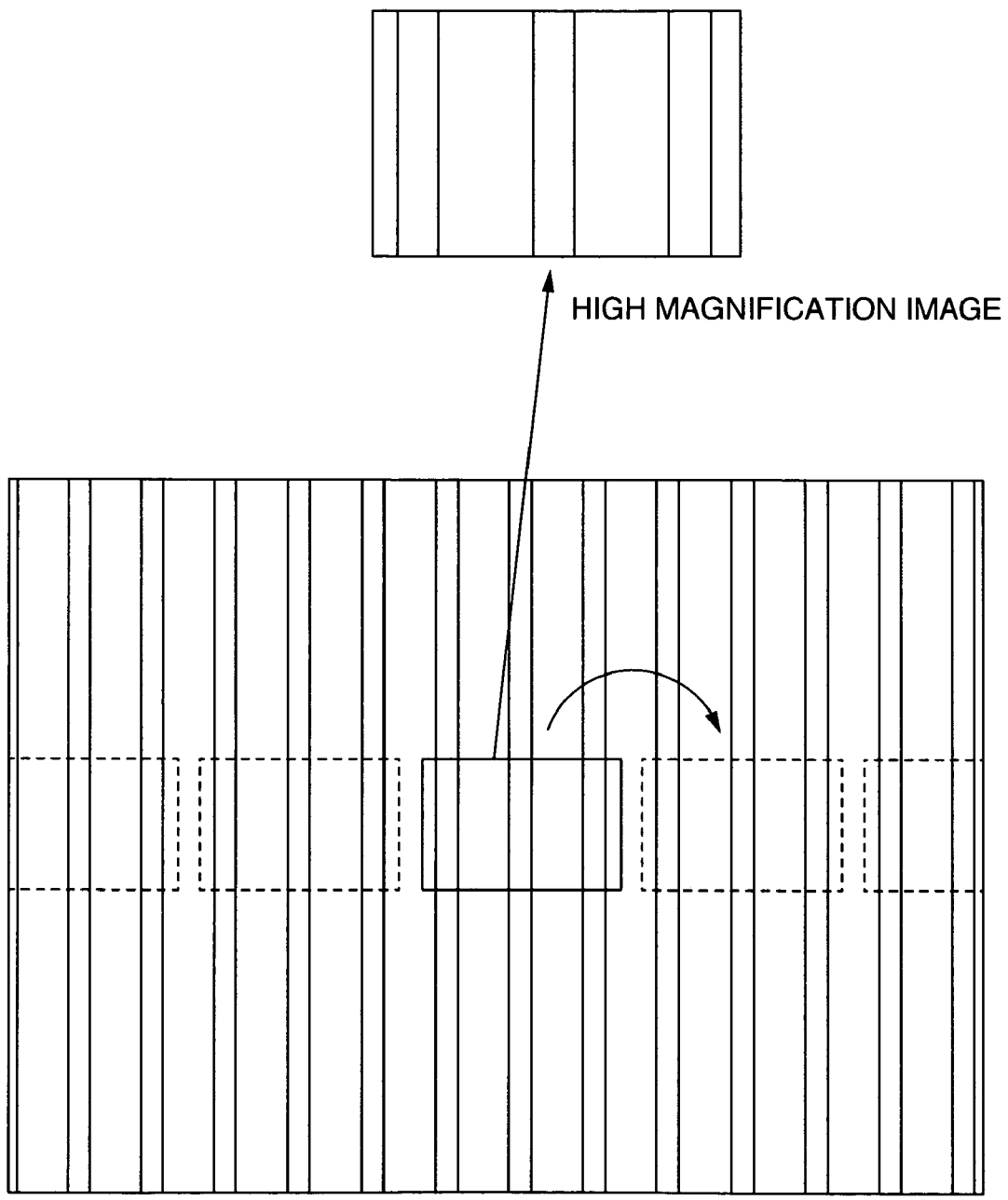
FIG. 10 is a diagram for illustratively showing an example as to a high precision pitch measuring method in the case that an SEM image of a reference material for image magnification contains a small amount of pitch information (namely, when image magnification is high).

As indicated in FIG. 10, in high image magnification (for instance, magnification of several hundreds and thousand), a very small pitch portion of a reference material is displayed as an image. At this time, if a pitch measuring operation is carried out only by using this information, then reliability of measurement values is lowered. In order to avoid lowering of the measurement reliability in the high image magnification, in such a case that a ratio of pitch pixel numbers exceeds a predetermined value (for example, 20%), as indicated by a dotted line of FIG. 10, a plurality of images may be acquired in different scanning areas (visual fields). Normally, movement of a visual field is carried out by controlling a beam irradiation position (namely, image shift). When a move amount is large, a sample stage may be moved so as to move a visual field.

Then, pitches are measured by using the auto-correlation function from the plurality of these images acquired in the above-described manner respectively, an average value is calculated from these measured pitches, and thus, this calculated averaged pitch value may be defined as a pitch measurement value of the reference material. In this embodiment 5, even in such a case that the image contains a small amount of pitch information, the reliability of the pitch measurement value which can be finally acquired can be increased.

Embodiment 6

Figure 11A:
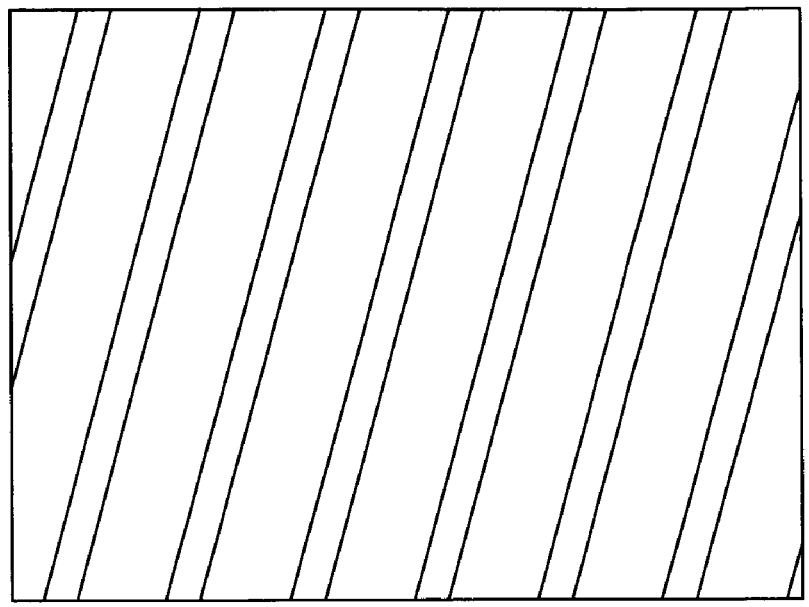
FIG. 11A and FIG. 11B are diagrams for illustratively representing a method for detecting both an SEM image and a rotation direction shift when a pattern of a reference material for image magnification is shifted along the rotation direction.
Figure 11B:
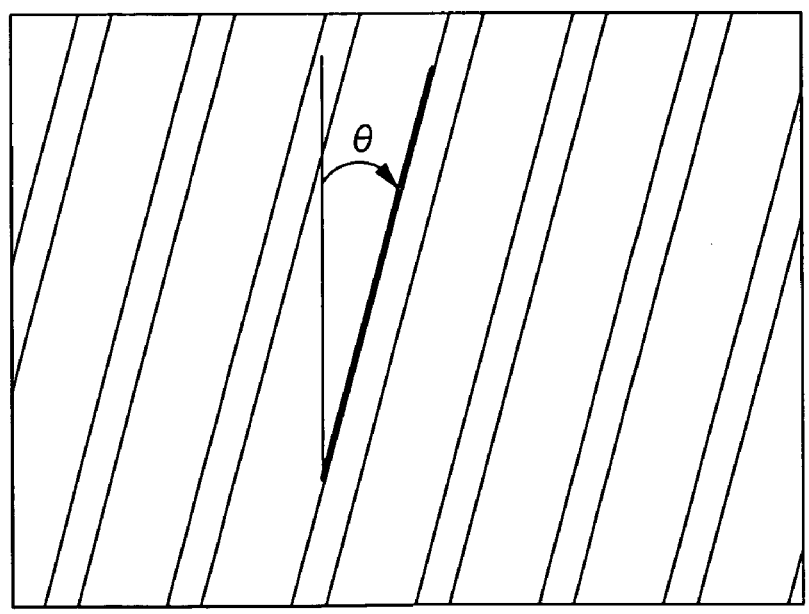

An embodiment 6 corresponds to such an example. That is, in the case that in an image whose pitch is tried to be measured, a direction of a pattern is not proper, a pitch measuring operation is not executed. FIG. 11A shows an SEM image formed under such a condition that a pattern of an acquired reference material is shifted along a rotation direction (clockwise direction). Under this condition, for example, when pitch information along the X direction is detected, a pitch measurement value is shifted by such a value that the rotation is shifted. To avoid this value shift, the following means is provided. This means detects edge information (edge line) of a pattern from an image, and also detects an angle defined between this detected edge line and either a horizontal line or a vertical line. As the method of detecting the edge line, for instance, there is a method for differentially processing an image so as to obtain a binary image. FIG. 11B illustratively indicates an example of a processed image in which the edge line has been extracted. If a straight line is extracted from this edge line, then a shift angle "θ" of the pattern along the rotation direction is obtained from an inclination of the straight line. In this embodiment 6, when the shift angle "θ" of the pattern along the rotation angle which is detected from the edge line is larger than, or equal to a predetermined angle (for example, ±5 degrees, or more), such an information "pitch measuring operation is invalid" is displayed and may be notified to an operator.

Furthermore, this shift angle "θ" is fed back to a beam scanning function (raster rotation function), so that an SEM image which does not produce a rotation shift may be newly acquired. Alternatively, in order that an image magnification error in a specific scanning direction is measured, when the raster rotation is moved at an angle which is larger than, or equal to a predetermined angle, since an image magnification error along the X direction is mixed with an image magnification error along the Y direction, in such a case that the shift angle "θ" becomes larger than, or equal to a preselected value (for example, larger than, or equal to 20°), this shift angle "θ" is not fed back to the raster rotation, but is fed back to a mechanical rotation operation of a stage, so that an SEM image which does not produce a rotation shift may be newly acquired. It should also be noted that such a "raster rotation" technique implies a technical idea capable of rotating a scanning direction of beams by utilizing either an electric field or a magnetic field.

Embodiment 7

In an embodiment 7, a description is made of a concrete example as to a means (process operation) for determining an optimum image acquisition condition (image magnification and total number of pixels) when both an image magnification control range for measuring a nominal pitch value and an image magnification error of a reference material, and a selection range for a total pixel number of an image.

Figure 12:
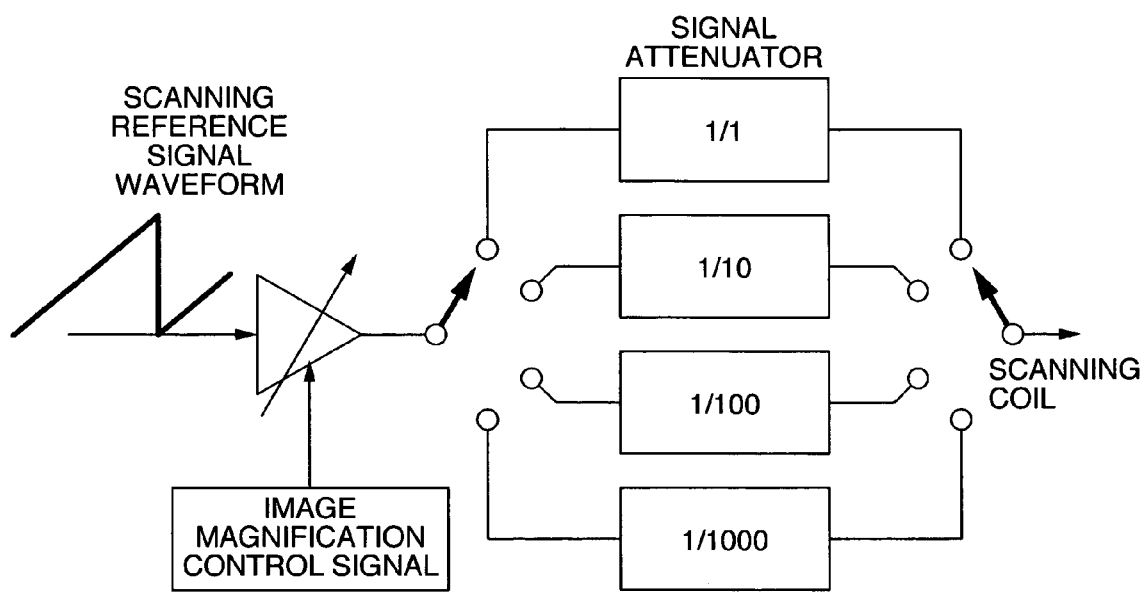
FIG. 12 is a block diagram for switching image magnification ranges of the SEM.

Since a range for image magnification of an SEM is defined from several tens of magnification to several hundreds and thousand of magnification, or more, an amplitude of a scanning signal supplied to a scanning coil requires a wide dynamic range. It is technically difficult to cover all of such a wide dynamic range only by a gain of a circuit. As a result, normally, as indicated in FIG. 12, while a circuit is arranged in such a manner that after a scanning signal is processed by an attenuator, the attenuated scanning signal is supplied to the scanning coil, attenuation ratios of the attenuator are switched with respect to each of image magnification ranges. At this time, due to errors contained in the attenuation ratios, different image magnification errors are produced every time an attenuation ratio (image magnification range) is switched. In order to correct this image magnification error, an image magnification calibration must be carried out every time an image magnification range is switched. An object of this embodiment 7 is to determine such an image acquisition condition under which the highest precision can be achieved in an image magnification error measuring operation within each of the image magnification ranges.

Assuming now that a pitch pixel number is "$N_{pitch}$", and a peak detection error (converted into pixel) for measuring a pitch is "P", a maximum value "$\epsilon$ (ACF)" of pitch measurement errors which are calculated based upon the auto-correlation function method is given by the following equation (7):

$$\epsilon(ACF) = P/N_{pitch} \qquad (7).$$

In this equation (7), symbol "ACF" is abbreviated from Auto Colleration Function. Also, since the pitch pixel number "$N_{pitch}$" is directly proportional to both image magnification "M" and a pixel number "$N_p$" along a pitch measuring direction, the above-explained equation (7) may be rewritten by the below-mentioned equation (8):

$$\epsilon(ACF) = K \times P/(M \times N_p) \qquad (8).$$

In this equation (8), symbol "K" indicates a conversion coefficient. In this embodiment 7, the pixel number "$N_p$" may be selected from 640, 1280, 2560, and 5120. When an image magnification range is determined under such a condition that both an accelerating voltage and WD are given, an image magnification control range (M1, M2) within this image magnification range may be exclusively determined from the values of the attenuator shown in FIG. 12. As a consequence, assuming now that a target value of the pitch measuring error is equal to "$\epsilon 0$", a combination between the image magnification "M" and the pixel number "$N_p$" may be determined which may satisfy the following equation (9):

$$\epsilon(ACF) = K \times P/(M \times N_p) < \epsilon_0 \qquad (9).$$

In this embodiment 7, when the image magnification owns a top priority, such a pixel number "$N_p$" capable of satisfying the above-described equation (9) in the lowest image magnification (M1) within the image magnification range is fined out from the selection tree. On the other hand, when the pixel number "$N_p$" has a top priority, such an image magnification capable of satisfying the above-described equation (9) is determined from the range defined from "M1" up to "M2." It should be understood that when any of the above-described selecting operations cannot satisfy the above-described equation (9), such a condition ($M \cdot N_p$) that the pitch measuring error of this equation (9) can be approximated to the target value "$\epsilon 0$" in the highest degree.

On the other hand, a maximum error "$\epsilon$(FFT)" in the case that a pitch measurement is carried out by employing the FFT transformation is given by the following equation (10):

$$\epsilon(FFT) = (N_{pitch}/N_p) \times P \qquad (10).$$

Similar to the above-explained condition of the auto-correlation function, since the pitch pixel number "$N_{pitch}$" is directly proportional to both the image magnification "M" and the pixel number "$N_p$" of the pitch measuring direction, the above-explained equation (7) may be rewritten as follows:

$$\epsilon(FFT) = K \times M \times P \qquad (11).$$

As a consequence, in the case that the pitch is measured by employing the FFT transformation, the lowest image magnification (M1) within the range is selected. It should also be noted that if a value as to the pitch pixel number "$N_{pitch}$" is smaller than, or equal to 2 pixels, then periodic information is lost from an image. Therefore, a specific care should be taken in a process operation when an image magnification selection is carried out in such a manner that a value as to the pitch pixel number may become larger than, or equal to at least 3 pixels.

Embodiment 8

An embodiment 8 describes such an example that an image magnification calibration is automatically carried out. That is, a pitch measurement value of a reference material which has been detected by executing the methods described in the previous embodiment, or similar methods is fed back to an image magnification control in order that an image magnification calibration is automatically carried out.

A scanning signal flows through a scanning coil of an SEM, while this scanning signal is used so as to scan primary beams on a material. At this time, assuming now that an amplitude of the scanning signal is "Id", and image magnification of the SEM is "M", an image magnification control circuit controls this amplitude "Id" in such a manner that the below-mentioned relationship (12) can be satisfied:

$$Id = K_1 \times K_2 \times (1/M) \tag{12}$$

In this equation (12), symbol "$K_1$" corresponds to an image magnification controlling coefficient which is obtained by a control CPU in accordance with a calculation of an electo-optical system in connection with an accelerating voltage, WD, an image magnification range, and so on. Further, symbol "$K_2$" represents an image magnification correcting coefficient which is used to increase the image magnification control precision by correcting a control error of the image magnification controlling coefficient. If the image magnification control is performed in an ideal manner, then "$K_2$" may be made equal to 1. However, an image magnification error is produced due to an image magnification control error is an actual apparatus. A decision of a value as to the image magnification correcting coefficient "$K_2$" used for correcting this image magnification error corresponds to an image magnification calibration.

When a pitch dimension "$L_m$" of a reference material for image magnification is measured by executing the methods which have been indicated in the embodiment 1 to the embodiment 7, or similar methods thereto, a relationship between the control image magnification "M" and image magnification "$M_0$" (true value) defined by the pitch dimension of the reference material for image magnification may be calculated from a nominal pitch value "$L_s$" of the reference material as follows:

$$M/M_0 = L_m/L_s \tag{13}$$

For example, assuming now that the pitch measurement value ($L_m$) is measured to be such a value larger than the nominal value ($L_s$), this assumed measurement result implies that the control image magnification "M" causes an image magnification error along a plus direction with respect to the correct image magnification "$M_0$."

In order to correct this image magnification error (calibration of image magnification), the image magnification correcting coefficient ($K_2$) defined in the above-explained equation (12) may be substituted by the below-mentioned formula (14):

$$K_2 \Rightarrow K_2 \cdot \frac{L_m}{L_s} \tag{14}$$

In other words, when the control image magnification "M" is shifted along the plus direction (namely, amplitude of scanning signal is shifted along small amplitude direction), the correcting coefficient "$K_2$" may be corrected (calibrated) along such a direction that the amplitude of the scanning direction is increased. In this embodiment 8, the formula (14) is automatically calculated from both the pitch measurement value ($L_m$) obtained in the measurement for the image magnification error, and the set nominal pitch value ($L_s$), so that the control image magnification is carried out.

Since the image magnification correcting coefficient "$K_2$" can be independently set for that of the X scanning operation and that of the Y scanning operation, in this embodiment 8, a selection may be made as to such a case that the coefficient correction of the formula (14) is executed in the pitch measuring direction (namely, any one of X direction and Y direction), and such a method for reflecting the measurement result to both the correction coefficients along the X direction and the Y direction at the same time.

Embodiment 9

An embodiment 9 describes such an example that a dimension of an application image is measured in high precision. That is, while an image as to the acquired reference material for image magnification and an actual application image are acquired under the same apparatus observation condition (accelerating voltage and WD), a dimension of the application image is measured from these acquired images in the high precision.

In accordance with the embodiments which have been so far described, the pitch ($L_m$) of the reference material can be measured from the image of the reference material for image magnification can be measured in the high precision. If this pitch value ($L_m$) and the nominal pitch value ($L_s$) are employed, then the below-mentioned conversion is carried out with respect to the dimension (L) which has been measured in the actual application, so that such a dimension (L') can be obtained in high precision:

$$L' \Rightarrow L \cdot \frac{L_s}{L_m} \tag{15}$$

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A charged particle beam apparatus comprising:
   a charged particle source;
   a charged particle optical system for focusing a charged particle beam emitted from said charged particle source and for scanning the focused charged particle beam on a material;
   a detector for detecting a secondary signal particle which is emitted from said material by being scanned by said charged particle beam; and
   a control apparatus for detecting an image which is formed by detecting said secondary signal particle, or for detecting periodic information of said material from a line profile, and for measuring an image magnification error based upon the detected periodic information, wherein the control apparatus detects said periodic information by way of an auto-correlation function method in a case that pixel number corresponding to a predetermined portion on said material is larger than a predetermined value, and detects said periodic information by way of a FFT transforming method in a case that pixel number corresponding to a predetermined portion on said material is equal to or smaller than a predetermined value.

2. A charged particle beam apparatus as claimed in claim 1 wherein:
said control apparatus measures the image magnification error of said charged particle beam based upon said detected periodic information, and either a pixel size of said image or set image magnification of said image.

3. A charged particle beam apparatus as claimed in claim 2 wherein:
said control apparatus calculates an auto-correlation function as to either said image or said line profile so as to calculate said periodic information.

4. A charged particle beam apparatus as claimed in claim 2 wherein:
said control apparatus averages said line profile along a predetermined direction, shifts said averaged line profile along a direction different from said predetermined direction so as to calculate an auto-correlation function, and acquires a peak of a correlation value from a distribution of said calculated auto-correlation function.

5. A charged particle beam apparatus as claimed in claim 2 wherein:
said control apparatus FFT (Fast Fourier Transformation) transforms said image so as to detect said periodic information.

6. A charged particle beam apparatus as claimed in claim 2 wherein:
said control apparatus changes an image magnification control parameter based upon said measured image magnification error.

7. A charged particle beam apparatus as claimed in claim 2 wherein:
said control apparatus determines both a total pixel number and image magnification when an image is acquired based upon a material pitch dimension known in the technical field, a selection range for pixel numbers of images, and a selection range of image magnification, and then, said control apparatus acquires an image based upon said determined pixel size and said determined image magnification.

8. A charged particle beam apparatus as claimed in claim 1 wherein:
said control apparatus is comprised of:
display means for displaying thereon a message in the case that said measured image magnification error exceeds a predetermined range.

9. A charged particle beam apparatus as claimed in claim 1, further comprising:
a display apparatus for displaying thereon said measured image magnification error.

10. A charged particle beam apparatus, comprising:
a charged particle source;
a charged particle optical system for focusing a charged particle beam emitted from said charged particle source and for scanning the focused charged particle beam on a material;
a detector for detecting a secondary signal particle which is emitted from said material by being scanned by said charged particle beam; and
a control apparatus for detecting an image which is formed by detecting said secondary signal particle, or for detecting periodic information of said material from a line profile, and for measuring an image magnification error based upon the detected periodic information, wherein:
said control apparatus detects said periodic information on the basis of a plurality of images obtained in selectively different visual fields in a case that a ratio of a pixel number of a predetermined portion of said material to a pixel number in an image is larger than a predetermined value; and
in such a case that a periodic repletion number which is obtained by dividing a total pixel number of said image by a pixel number of said detected periodic information is smaller than a preset value, said control apparatus acquires images in a plurality of different visual fields which have been determined in correspondence with said periodic number, detects a period from each of said acquired plural images, and then, calculates an averaged value from said plurality of the detected periodic information so as to set said averaged value as a representative value of the periods.

11. A charged particle beam apparatus as claimed in claim 10 wherein:
said plurality of the different visual fields are obtained by electrically moving (deflecting) an irradiation position of the charged particle beam.

12. A charged particle beam apparatus as claimed in claim 10 wherein:
said control apparatus measures the image magnification error of said charged particle beam based upon said detected periodic information, and either a pixel size of said image or set image magnification of said image.

13. A charged particle beam apparatus as claimed in claim 10 wherein:
said control apparatus calculates an auto-correlation function as to either said image or said line profile so as to calculate said periodic information.

14. A charged particle beam apparatus as claimed in claim 10 wherein:
said control apparatus averages said line profile along a predetermined direction, shifts said averaged line profile along a direction different from said predetermined direction so as to calculate an auto-correlation function, and acquires a peak of a correlation value from a distribution of said calculated auto-correlation function.

15. A charged particle beam apparatus as claimed in claim 10 wherein:
said control apparatus FFT (Fast Fourier Transformation)—transforms said image so as to detect said periodic information.

16. A charged particle beam apparatus as claimed in claim 10 wherein:
said control apparatus changes an image magnification control parameter based upon said measured image magnification error.

17. A charged particle beam apparatus as claimed in claim 10 wherein:
said control apparatus is comprised of:
display means for displaying thereon a message in the case that said measured image magnification error exceeds a predetermined range.

18. A charged particle beam apparatus as claimed in claim 10, further comprising:
   a display apparatus for displaying thereon said measured image magnification error.

19. A charged particle beam apparatus as claimed in claim 10 wherein:
   said control apparatus determines both a total pixel number and image magnification when an image is acquired based upon a material pitch dimension known in the technical field, a selection range for pixel numbers of images, and a selection range of image magnification, and then, said control apparatus acquires an image based upon said determined pixel size and said determined image magnification.

* * * * *